United States Patent
Schneider et al.

(10) Patent No.: US 7,828,987 B2
(45) Date of Patent: Nov. 9, 2010

(54) ORGANIC BARC ETCH PROCESS CAPABLE OF USE IN THE FORMATION OF LOW K DUAL DAMASCENE INTEGRATED CIRCUITS

(75) Inventors: Jens Karsten Schneider, Dresden (DE); Ying Xiao, San Jose, CA (US); Gerardo A. Delgadino, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 135 days.

(21) Appl. No.: 11/385,256

(22) Filed: Mar. 20, 2006

(65) Prior Publication Data

US 2007/0218679 A1 Sep. 20, 2007

(51) Int. Cl.
*B44C 1/22* (2006.01)

(52) U.S. Cl. .......................... 216/67; 216/72; 438/700; 438/702; 438/703; 438/710; 438/718

(58) Field of Classification Search ................. 216/67, 216/72; 438/700, 692, 703, 710, 718, 723
See application file for complete search history.

(56) References Cited

U.S. PATENT DOCUMENTS

| | | | |
|---|---|---|---|
| 5,338,398 A | 8/1994 | Szwejkowski et al. | |
| 5,492,597 A | 2/1996 | Keller | |
| 6,207,580 B1 | 3/2001 | Costaganna | |
| 6,376,366 B1 * | 4/2002 | Lin et al. | 438/637 |
| 6,399,511 B2 * | 6/2002 | Tang et al. | 438/714 |
| 6,407,004 B1 | 6/2002 | Kimura et al. | |
| 6,410,422 B1 | 6/2002 | Sun et al. | |
| 6,495,469 B1 | 12/2002 | Yang et al. | |
| 6,531,403 B2 | 3/2003 | Ezaki | |
| 6,613,689 B2 | 9/2003 | Liu et al. | |
| 6,774,031 B2 | 8/2004 | Ali et al. | |
| 6,861,347 B2 * | 3/2005 | Lee et al. | 438/622 |
| 6,875,699 B1 | 4/2005 | Lassig et al. | |
| 7,109,119 B2 * | 9/2006 | Bao et al. | 438/700 |
| 2004/0038547 A1 | 2/2004 | Son et al. | |
| 2005/0266691 A1 * | 12/2005 | Gu et al. | 438/706 |

OTHER PUBLICATIONS

D. Fuard, Journal of Vacuum Science & Technology, B 19(2), Mar./Apr. (2001), pp. 447-455.*
PCT International Searching Authority-US, International Search Report (ISR) for PCT/US07/07010, mailed Jun. 16, 2008; 2 pages.
PCT International Searching Authority-US, Written Opinion of the International Searching Authority for PCT/US07/07010, mailed Jun. 16, 2008; 3 pages.

* cited by examiner

*Primary Examiner*—Lan Vinh
*Assistant Examiner*—Maki A Angadi
(74) *Attorney, Agent, or Firm*—Blakely, Sokoloff, Taylor & Zafman LLP

(57) ABSTRACT

In some implementations, a method is provided in a plasma reactor for etching a trench in an organic planarization layer of a resist structure comprising a photoresist mask structure over a hardmask masking the organic planarization layer. This may include introducing into the plasma reactor an etchant gas chemistry including $N_2$, $H_2$, and $O_2$ and etching a masked organic planarization layer using a plasma formed from the etchant gas chemistry. This may include etching through the planarization layer to form a trench with a single etch step.

24 Claims, 2 Drawing Sheets

ORGANIC BARC ETCH PROCESS CAPABLE OF USE IN THE FORMATION OF LOW K DUAL DAMASCENE INTEGRATED CIRCUITS

CROSS REFERENCE TO RELATED APPLICATION

This application is related to the following commonly-owned application: application Ser. No. 11/388,232, by Xiao et al., filed Mar. 22, 2006, entitled "METHODS FOR ETCHING A BOTTOM ANTI-REFLECTIVE COATING LAYER IN DUAL DAMASCENE APPLICATION."

BACKGROUND

Integrated circuits (IC) play a significant role in the field of modern semiconductor technology. The development of integrated circuits has made possible a modern world with advanced electrical technology. Applications of integrated circuits are so widespread and their significance affects our every day lives from cellular phones, digital televisions, to flash memory chips in cameras. The demand for more functionality requires an increase in the number of transistors to be integrated on to a dingle integrated circuit chip. These integrated circuits typically are formed on silicon substrates or wafers, which can include active semiconductor devices with structured processes for a wide range of stacked layers made from different materials, allowing for memory capabilities.

Recently, in modern semiconductor technology, integrated circuits have advanced towards smaller devices (transistors) with more memory. This typically requires shrinking the sizes of the transistors. As the sizes of the transistors decrease, the resulting increased density requires an increasing number of interconnections within the integrated circuit chip. In the manufacture of semiconductor integrated circuits (IC), successive levels can be made on a silicon wafer by etching vias and trenches in non-conducting materials and then filling them with aluminum, copper or other metal. Typically, in advanced silicon integrated circuit wiring, copper can be embedded in insulating materials with low dielectric constant values, resulting in fast chips.

In addition, as the number of transistors proliferate, multiple levels of interconnections are required between the interconnect lines and the vias which connect different levels.

Typically, in order for technology to fabricate high routing density, copper low k (dielectric) interconnects are used. Copper has found to be a better conductor and generally can be more robust than aluminum.

Typically, dielectric etch is used in the copper interconnect manufacturing sequence. Advantages with this method is that it can be repeated as many times as necessary, depending on the number of metal layers needed to create a specific device. Recently, the transition from 130 nm node to 90 nm and beyond is prompting used of a greater diversity of dielectric materials and filmstacks than were previously encountered.

Dual damascene is the dielectric etch approach most widely implemented for copper technology. Damascene typically is known to those skilled in the art as a process by which a metal conductor pattern is embedded within a non-conducting (dielectric) material. In dual damascene, the process sequentially creates embedded vias and trenches, with the vias forming vertical connections from one layer of circuitry (trenches) to the next. Etching the vias and trenches in the dielectric materials typically avoids the difficulties associated with etching copper, instead filling the etched features with copper through a sequence known as metallization.

As technology develops, progressive miniturization has brought with it a succession of technological needs and complexities. In response to these needs, thin film coatings known as anti-reflective coatings were developed. Available Anti-Reflective Coatings include top and bottom coatings (TARC and BARC), based on either organic or inorganic Bottom organic Anti-Reflective Coatings (BARC) typically are applied via spin-on deposition and can provide excellent fill and planarization performance, but can also suffer from poor etch selectivity relative to organic photoresists.

A bottom anti-reflective coating (BARC) and/or organic planarization layer (OPL) can function as patterning over previously etched features, as is in the case of a dual damascene etch. Dual layer BARC method is typically used for 130 nm, and typically is less costly.

As the design rule becomes tighter and tighter for the 65 nm technology node and beyond, trench CD uniformity and bias control, trench profile, trench depth uniformity, low-K dielectric integrity, and etch selectivity between TEOS/low-K dielectric (SiCO) and the BLoK etch stop layer (SiCN) can be a significant aspect in developing complex BARC-assisted low-K dual damascene etch processes. With respect to a dual damascene patterning scheme for copper/low-K dielectric materials, many challenges can be posed by dual damascene etch. Large trench CD non-uniformity, especially at lower level metal lines, such as M2 and M3, can cause either metal line bridging from too narrow of a space between metal lines in the wider CD area, or voids in the copper fill in high aspect ratio trenches in the narrower CD area.

In addition, an appropriate BARC recess into the via is critical to avoid via fence formation and excessive via faceting. This is because the fence could become the nucleus of a copper void resulting from insufficient copper barrier and seed coverage in the subsequent copper electrical plating process, while excessive via faceting would cause erosion of the BLoK etch stop layer during the low-K oxide trench etch. Non-uniform trench depth and low-K damage could increase RC delay, which could compromise device performance. Finally, a non-selective BLoK etch stop layer open can cause trench/via CD widening and excessive erosion of the TEOS cap layer, which could create an insufficient copper polish stop thus resulting in low k dielectric polish damage. Misalignment between the underlying copper line und upper via leads to notching that can cause voids during the copper plating process, giving rise to subsequent device reliability problems.

Traditionally, the organic BARC open process was based on $N_2/H_2$ chemistries to take advantages of their good CD and profile control. With this process, however, the present inventors have observed that there can be major disadvantages. The $N_2/H_2$ BARC open process can suffer severe reverse microloading effect caused by heavier hydrocarbon polymer formation in the wide trench area. This reverse microloading effect could cause either excessive BARC recess into the via in the narrow trench area or insufficient BARC recess into the via in the wide trench area.

Thus, there is a need to develop a novel BARC etch process in the formation of a dual damascene integrated circuit. Further, there is a need to achieve a microloading-free organic BARC open with excellent CD control and straight sidewall profile. Still further, there is a need to provide a process to overcome one or more of the aforementioned disadvantages, to provide improvements in low-K dual damascene trench profile, CD uniformity, and/or trench depth control.

As those skilled in the art would appreciate, there is a need for methods that can etch organic planarization layers in dual damascene etches. Such methods of etching should preferably not have the undesirable properties of low etch rate. Still further, there is a need for methods to etch BARC organic planarization layers in dual damascene etch, that are cost effective, have high selectivity, and a reasonably high etch rate.

SUMMARY

In some implementations, a method is provided in a plasma reactor for etching a trench in an organic planarization layer of a resist structure comprising a photoresist mask structure over a hardmask masking the organic planarization layer. This may include introducing into the plasma reactor an etchant gas chemistry comprising: $N_2$; $H_2$; and $O_2$ and etching the masked organic planarization layer using a plasma formed from the etchant gas chemistry. This may include etching through the planarization layer to form a trench with a single etch step. In some implementation, the introduction of the $O_2$ can be used to modulate etch rate microloading during the etching of the organic planarization material.

In some implementations, the etchant gas chemistry of $N_2$:$H_2$:$O_2$ has a flow ratio of about 10:10:x, where x is in a range of about one to three. In some implementations, the etchant gas chemistry of $N_2$:$H_2$:$O_2$ has a flow ratio of about 10:10:1. In other implementations the flow ratio is about 10:10:2. Further, in some implementations, the bias power frequency is about 13.56 MHz or less, and in some implementations a bias power of about 2 MHz is used. Furthermore, the plasma source power may be between about 300 Watts and about 2000 Watts. In one implementation, a bias power frequency of about 13.56 MHz at about 800 Watts, with a plasma source power of about 1200 Watts, at a ratio of about 10:10:2 is used.

DESCRIPTION

In one a method of forming a low k dual damascene structure using a BARC assisted etch process, an $N_2H_2$ chemistry with oxygen is used to modulate etch rate microloading during etching of an organic planarization material or OPL.

This unique gas etchant mixture chemistry can control undercut and profile taper and thus provide CD control of OPL etch for a trilayer resist integration scheme widely used for advanced Dual Damascene structures by gas ratio adjustment ($N_2$:$H_2$ ratio).

Addition of $O_2$ to this reducing chemistry can modulate etch rate microloading (i.e. different etch rate in small verses large features). A gas mixture of $N_2$/$H_2$ alone can etch slower in larger features, which is not advantageous. Therefore, in some implementations, the addition of $O_2$ increases etch rate in large features. In yet another implementation, this process can be applied for etching of other organic materials such as spin-on low-K, Carbon hardmask, etc.

Figure 1A:
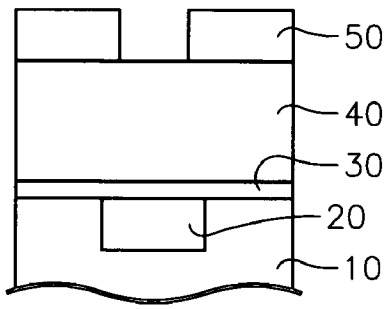
FIG. 1a shows a cut away side view of a substrate showing the forming a via patterned photoresist layer over a low k dielectric layer, the dielectric layer formed over an etch stop layer on a substrate, the substrate having a first trench metal layer.

FIG. 1a shows a cut away side view of a substrate showing the forming a via patterned photoresist layer over a low k dielectric layer 40, the low k dielectric layer being formed over a etch stop layer 30 on a substrate 10, the substrate 10 having a first trench metal layer 20.

Referring now particularly to FIG. 1a, there is shown a cross section of a partially completed integrated circuit device of some implementations. A dual damascene via will be used for example purposes. A semiconductor substrate 10 is provided. To simplify the illustration, the semiconductor substrate 10 is shown as a single layer. The base of the semiconductor substrate 10 preferably comprises monocrystalline silicon. The semiconductor substrate 10 may additionally comprise any of the several additional microelectronics layers, such as conductive layers and insulator layers, interconnect structures such as vias, contact holes, and conductive lines, and device structures, such as gate electrodes and doped junctions.

Metal layer 20 is formed overlying the substrate 10. Preferably, the metal layer 20 comprises copper electrodes. It is also understood that the copper conductors may be part of a dual damascene or single damascene interconnect structure, which is not shown. The copper conductors can be formed by any method known to those skilled in the art. Preferably, for example, the copper layer 20 is deposited by a sequence of physical vapor deposition (PVD), electroplating, and chemical mechanical polishing (CMP). The copper layer 20 is then patterned to form copper conductors.

An etch stop layer 30 is deposited overlying the substrate metal layer 20. In some implementations, the dual damascene trench etching method uses this etch stop layer 30 to facilitate creation of the upper level, or interconnect, trenches. In some implementations, the etch stop layer 30 can also be used to prevent oxidation or out diffusion of copper from the copper conductors in the metal layer 20 into overlying dielectric materials during dry etching. The etch stop layer 30 may comprise, silicon nitride, silicon oxynitride, copper barrier low k film or Blok™ by Applied Materials Corp., silicon carbide, or boron nitride. The etch stop layer 30 preferably comprises Blok™ by Applied Materials Corp. The etch stop layer 30 is deposited to a thickness of between about 300 Angstroms and 1,000 Angstroms.

A low k dielectric layer 40 is deposited overlying the etch stop layer 30. The purpose of the low k dielectric layer 40 is to provide a dielectric barrier for the subsequently formed single damascene interconnects. Preferably, the low k dielectric constant is less than 4.0 and is formed by typical methods known to those skilled in the art. In addition, by using a material with a low dielectric constant, the capacitance loading and coupling problems can be minimized. The first low dielectric constant layer 40 preferably comprises organic material, carbon-doped silicon dioxide, or hydrogen-doped silicon dioxide. Alternatively, undoped silicon dioxide, or fluorinated silicon dioxide may be used. Material types that fall under these descriptions and that could be used to form the first low dielectric constant layer 62 include, but are not limited to: porous organic materials, non-porous organic materials, porous fluorinated organic materials, non-porous fluorinated organic materials, porous hydrogen-doped silicon dioxide, non-porous hydrogen-doped silicon dioxide, porous carbon-doped silicon dioxide, and non-porous carbon-doped silicon dioxide. Specific materials include, but are not limited to: poly(arlene) ether or SILK™ by Dow Chemical Corp., fluorinated aryl ether or FLARE™ by Allied Signal Corp. or Honeywell Corp., amorphous fluorocarbon ($\alpha$-C:F), polytetrafluoroethylene (PTFE™) or Teflon™ by Dupont Corp., parylene-F, parylene, alkyl silsesquioxane, aryl silsesquioxane, poly(silazane), poly(arylene)ether, silica doped with methane or Black Diamond™ by Applied Materials Corp., carbon doped silicon dioxide or Coral™ by Novellus Corp., fluorinated poly(arylene) ether, and hydrogen silsesquioxane. Preferably, the low dielectric constant layer is Black Diamond™ by Applied Materials Corp. The first low dielectric constant layer 40 may be deposited by spin coating. The spin coating may be followed by aging or by a thermal treatment in a furnace or in rapid thermal annealing (RTA) equipment. The first low dielectric constant layer 40 is preferably deposited to a thickness of between about 2,000 Angstroms and 10,000 Angstroms.

As an important feature, an organic photoresist layer 50 is deposited overlying the low k dielectric layer 40 according to FIG. 1a. An optional organic bottom anti-reflective coating (BARC) may also be applied. The photoresist layer 50 will be patterned to form a mask for the vias or trenches. Preferably, the photoresist layer provides equal reflectivity across the patterning substrate surface with sufficient absorbing properties at 193 nm. The photoresist layer 50 may comprise one of the several light sensitive compounds that are commonly used in the art.

Figure 1B:
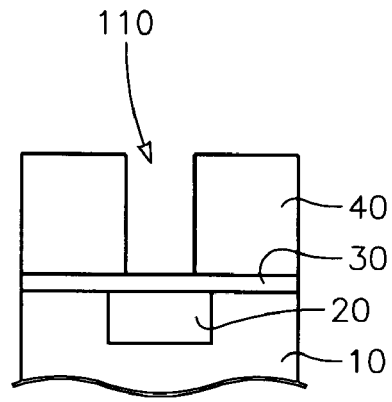
FIG. 1b shows a cut away side view of a substrate showing the removal of the photoresist layer after via lithography and showing of the via etch into the low k dielectric layer, stopping at the etch stop layer.

Referring to FIG. 1b, shows the removal of the photoresist layer after via lithography and shows results of the desired via etch 110 into the low k dielectric layer, stopping at the etch stop layer.

Figure 1C:
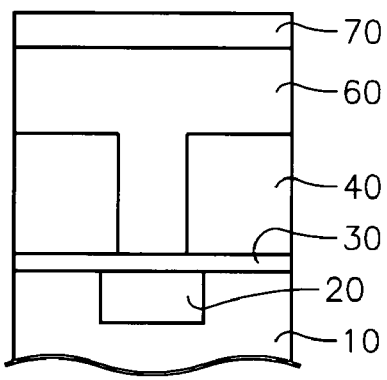
FIG. 1c shows a cut away side view of a substrate showing the forming the BARC organic planarization layer and SOG layer spun on to fully cover the via.
Figure 1D:
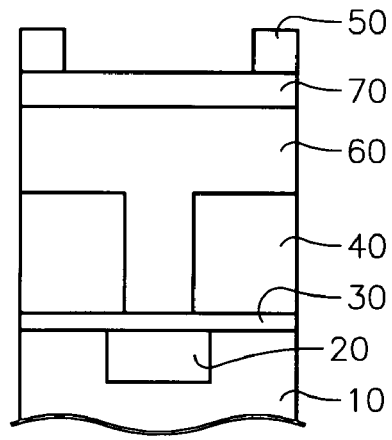
FIG. 1d shows a cut away side view of a substrate showing the forming of a trench pattern photoresist layer on the SOG/BARC organic planarization layer.

The photoresist layer 50, shown in FIG. 1D, can be patterned using a typical photolithographic process where it is exposed to light through a mask. A developing process removes the undesired photoresist layer 50 to expose the low k dielectric layer 40 or an optional BARC layer, where the trenches are planned.

Typically, photoresist layers can be stripped in accordance to those methods known to those skilled in the art, such as using oxygen ashes or solvents, followed by cleaning.

Referring to FIG. 1c, in one implementation, the method shows the formation of the BARC organic planarization layer and SOG layer spun on to fully cover the via. In one embodiment, a hard mask layer 70 is formed over the BARC organic planarization layer by any method known to those skilled in the art. Typically the hard mask such can be LTO, plasma enhanced chemical vapor deposition oxide or PECVD oxide, BSG or Boron doped spin on glass, other oxide hard mask, silicon nitride, or other hard mask.

With respect to FIG. 1d, in one implementation, the forming of a trench pattern photoresist layer 50 on the SOG/BARC organic planarization layer is shown. Again, the photoresist layer 50 can be formed to those methods previously described and well known to those skilled in the art, and a trench pattern is etched.

Figure 1E:
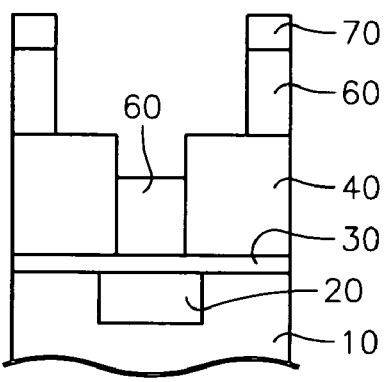
FIG. 1e shows a cut away side view of a substrate showing the forming of the BARC organic planarization layer open to recess BARC organic planarization layer into the via after the SOG etch.

Referring to FIG. 1e, in one implementation, the forming of the BARC organic planarization layer open to recess BARC organic planarization layer into the via after the SOG etch. An etchant gas mixture containing a $N_2$:$H_2$/$O_2$ is used to etch the organic planarization BARC layer 60 during this step.

With respect to FIG. 1e, in one implementation, the etching of the BARC organic planarization layer 60 is N2:H2/O2. The ratio of $N_2$ to $H_2$, to $O_2$, is selected to provide a desired etch rate and high selectivity to the BARC organic planarization layer 60. The BARC organic planarization layer 60 has a similar content to photoresist.

In one implementation, traditional OPL etch process for low K dual damascene etch with trilayer resist integration scheme is $N_2/H_2$-based where $H_2$ is the source of OPL sidewall passivation and $N_2$ is the source of etching radical. Tuning of $N_2/H_2$ ratio provides the optimal combination of $N_2$ and $H_2$ to achieve the best CD and profile control. In some implementations, the a superior profile was achieved with a 1:1 $N_2/H_2$ ratio. With $N_2$ flow lower than $H_2$ flow, excessive sidewall passivation resulted in a tapered OPL profile and reduced bottom CD. In some implementations, with $N_2$ flow higher than $H_2$ flow, pull-back occurred at top of the OPL, indicating insufficient passivation. In some implementations, low pressure in a range of about 10 mTorr to about 200 mTorr is needed for good CD and profile. Although the 1:1 $N_2/H_2$ process at low pressure achieves vertical OPL profile with good CD control, severe reverse micro-loading can be observed. Heavier hydrocarbon polymer can form in which can slow down the OPL etch rate.

With respect to some implementations, a $N_2/H_2$ 1:2 ratio can be used but may result in excessive OPL sidewall passivation and negative CD bias. Further, a N2:H2 2:1 ratio can be used but insufficient OPL sidewall passivation may be seen in some implementations.

Reverse micro-loading in a typical $N_2/H_2$ OPL etch process can result in a faster etch rate and larger OPL plug recess in narrow trench areas due to lighter hydrocarbon polymer formation compared to slower etch rates and smaller OPL plug recess in wide trench area due to heavier hydrocarbon polymer formation.

Thus, any etch rate micro-loading for the OPL part can effect the overall performance, for example, overall CD control, and fencing verses corner rounding performance defined by the window of OPL plug recess allowed.

In various implementations, the addition of $O_2$ to the gas etchant mixture helps to etch the hydrocarbon polymer in the organic planarization layer 60 in wide trenches, thus increasing the etch rate in wide trenches more than in small trenches.

A sufficient amount of $O_2$ will match the etch rate in wide trenches to the one in small trenches i.e. reduce the micro-loading to at or near zero. A gas flow ratio $N_2/H_2/O_2$ of 10:10:1 shows a significant improvement if combined with wider ion energy distribution by utilisation of the lower frequency Bias power, for example 2 MHz, providing higher sputter component to crack the hydrocarbon polymer in wide trenches. In some implementations, the same gas flow ratio results in a higher micro-loading when run with higher frequency Bias, such as for example 13.56 MHz, which can be explained with the narrow ion energy band at lower ion energy in average as provided by higher Bias frequencies.

Therefore, sputtering component will be reduced resulting in slower etch rate in wide trenches due to described hydrocarbon polymer formation.

Reduced micro-loading for a $N_2/H_2/O_2$ OPL etch process with gas flow ratio of 10:10:1 and 2 MHz Bias results in slightly slower etch rate in wide trench compared to narrow trench, OPL plug recess difference more pronounced due to variance in OPL starting thickness. In one implementation, micro-loading for a $N_2/H_2/O_2$ OPL etch process with gas flow ratio of 10:10:1 and 13 MHz Bias results in reduced micro-loading compared to $N_2/H_2$ process but increased micro-loading compared to $N_2/H_2/O_2$ OPL etch with 2 MHz Bias.

Further, increased $O_2$ flow (ratio $N_2/H_2/O_2$ of 10:10:2), however, results in a very low etch rate micro-loading, even for the higher Bias frequency process emphasizing the role of oxygen when attempting to reduce the heavy hydrocarbon polymer formation in wide trenches.

RF-power levels (162 MHz Source and 2-13.56 MHz Bias) control etch rate and profile; source power controls the dissociation of $N_2$, $H_2$ and $O_2$ and etch rate and sidewall passivation; and bias power controls the overall ion energy level and etch rate, and the power ratio of bias frequencies controls ion energy distribution and etch rate micro-loading.

The source power may be in a range from about 300 Watts to about 2000 Watts. The bias power may be in a range from about 100 Watts to about 1500 Watts at bias power frequencies ranging from about 1 to about 13.56 MHz. In one implementation, the bias power frequency is about 13.56 MHz, the bias power is about 800 Watts, and the source power is 1200 Watts, with a ratio of $N_2/H_2/O_2$ of 10:10:2.

Figure 1F:
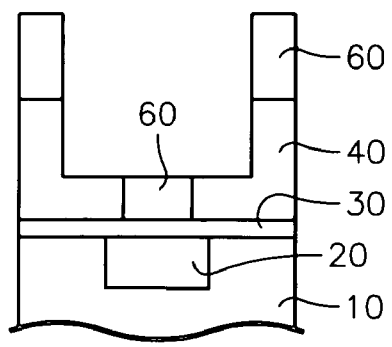
FIG. 1f shows a cut away side view of a substrate showing the forming a trench pattern using BARC organic planarization layer as an etch mask.

Referring to FIG. 1f, in one implementation, the forming a trench pattern using BARC organic planarization layer as an etch mask is shown. The hard mask layer 70, BARC organic planarization layer 60, and the optional cap layer 80 (FIG. 2) and the low k dielectric layer 70 are etched through to form the interconnect trench. This etching is typically performed using methods known to those skilled in the art.

Figure 1G:
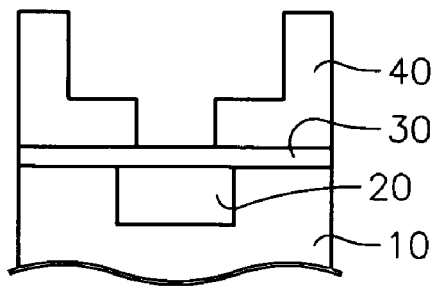
FIG. 1g shows a cut away side view of a substrate showing the stripping of the BARC organic planarization layer on top of the low k dielectric layer and in the via is ashed in situ.

Referring to FIG. 1g, in one implementation, the stripping of the BARC organic planarization layer on top of the low k dielectric layer and in the via is ashed in situ. Preferably, the step is stopped at the etch stop layer 30. Here the use of the optional etch stop layer 30 facilitates easier formation of separate interconnect and via levels in the dual damascene structure.

Figure 1H:
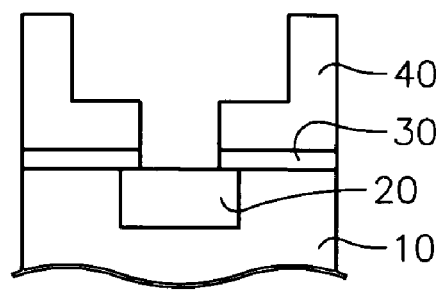
FIG. 1h shows a cut away side view of a substrate showing the completion of the etch stop layer open process by connecting the dual damascene structure of FIG. 1f to the underlying metal layer.

Referring to FIG. 1h, in one implementation, the showing of the completion of the etch stop layer 30 open process by connecting the dual damascene structure of FIG. 1f to the underlying metal layer is shown. In an another implementation, an optimized low K oxide dual damascene trench etch, and innovative SiCN etch has been developed for the 65 nm technology node and beyond. This new enabling etch process delivered excellent CD uniformity of 2.9% and CD bias of less than 5 nm, tight M2 snake resistance distribution of 4%.

Figure 2:
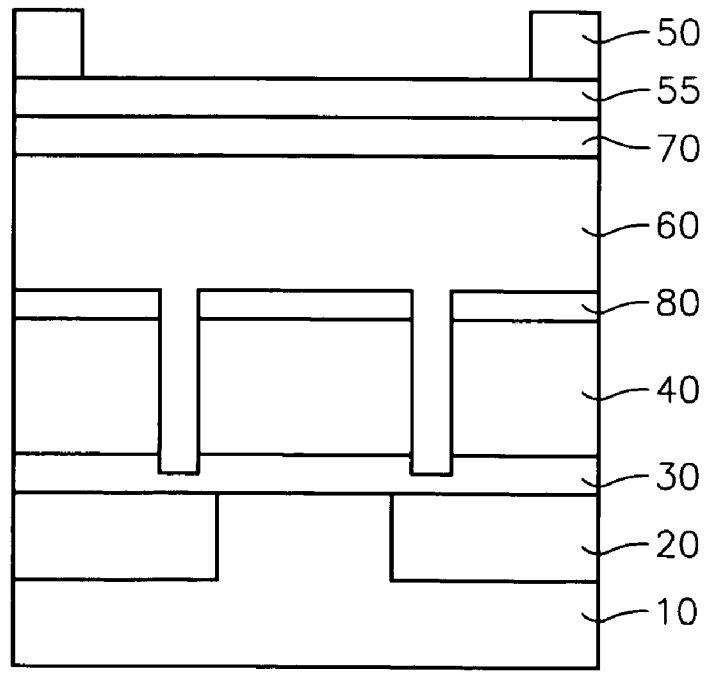
FIG. 2 shows a cut away side view of the substrate showing FIG. 1d with and optional cap layer between the low k dielectric layer and the BARC organic planarization layer 60.

Referring to FIG. 2, in one implementation, FIG. 1d is shown with an optional cap layer between the low k dielectric layer 40 and the BARC organic planarization layer 60. The cap layer 80 preferably comprises TEOS, silicon nitride, silicon oxynitride, or silicon carbide that has been deposited by methods known to those skilled in the art, to a thickness of between about 500 Angstroms and 5,000 Angstroms. Also, an optional BARC layer 55 may be located under the photoresist 50.

While the invention has been particularly shown and described with reference to the preferred embodiments thereof, it will be understood by those skilled in the art that various changes in form and details may be made without departing from the spirit and scope of the invention. At the same time, it is evident that the same methods may be employed in other, similar process steps that are to numerous to cite. For example, the approach of the present invention may be extended and applied to the formation of triple-level, or greater, damascene structures without departing from the spirit and scope of the invention.

Furthermore, the dual damascene structure that is illustrated herein is formed "via first." The structure can also be formed "trench first" or by using a "self-aligned via" technique or by another well-known technique of the art without departing from the scope and spirit.

What is claimed is:

1. A method in a plasma reactor of etching a BARC organic planarization layer of a resist structure comprising a photoresist mask structure over a hardmask masking the organic planarization layer, the method comprising:
   introducing into the plasma reactor an etchant gas chemistry comprising: N2; H2; and O2; and
   etching the organic planarization layer, masked by the photoresist mask structure and the hardmask, using a plasma formed from the etchant gas chemistry, wherein introducing the etchant gas chemistry comprises introducing the O2 so as to modulate etch rate microloading during the etching of the organic planarization material and a flow ratio of N2 to H2 is about 1.

2. The method of claim 1, wherein etching the organic planarization layer comprises etching through the planarization layer to form a trench in the organic planarization layer.

3. The method of claim 2, wherein etching through the planarization layer to form the trench comprises etching through the planarization layer with a single etch step.

4. The method of claim 2, wherein etching the organic planarization layer comprises etching trenches of disparate cross-sectional areas with a substantially same etch rate.

5. The method of claim 1, wherein introducing comprises introducing the etchant gas chemistry of N2:H2:O2 with a flow ratio of about 10:10:x, respectively, where x is in a range of about one to about three.

6. The method of claim 5, wherein etching the organic planarization layer comprises using a bias power frequency of one of: (a) about 13.56 MHz; or (b) less than about 13.56 MHz.

7. The method of claim 6, wherein etching the organic planarization layer comprises using a bias power of between about 100 Watts to about 1500 Watts.

8. The method of claim 7, wherein etching the organic planarization layer comprises using a plasma source power of between about 300 Watts to about 2000 Watts.

9. The method of claim 1, wherein introducing comprises introducing comprises introducing the etchant gas chemistry of N2:H2:O2 with a flow ratio of about 10:10:1, respectively.

10. The method of claim 9, wherein etching the organic planarization layer comprises using a bias power frequency of about 2 MHz.

11. The method of claim 1, wherein introducing comprises introducing the etchant gas chemistry of N2:H2:O2 with a flow ratio of less than about 10:10:2, respectively.

12. The method of claim 11, wherein etching comprises etching with a bias power frequency of about 13.56 MHz, a bias power of about 800 Watts, and a plasma source power of about 1200 Watts.

13. The method of claim 1, wherein etching the organic planarization layer comprises using a bias power of about 2 MHz.

14. The method of claim 1, wherein etching the organic planarization layer comprises using a bias power of less than about 13.56 MHz.

15. The method of claim 1, wherein etching the organic planarization layer comprises etching away the photoresist mask while etching the organic planarization layer.

16. The method of claim 1, wherein etching the masked organic planarization layer using a plasma formed from the etchant gas chemistry comprises forming a mask from the organic planarization layer for etching a low-k material thereunder.

17. A method using a plasma reactor for forming a low k damascene integrated circuit device, the method comprising etching a BARC organic planarization layer of a resist structure comprising a photoresist mask over a hardmask masking the BARC organic planarization layer, wherein etching the BARC organic planarization layer comprises:
   introducing into the plasma reactor an etchant gas chemistry comprising: N2; H2; and O2 with a gas flow ratio of 10:10:x, where x is in a range from about 1 to about 3; and
   etching the BARC organic planarization layer using a plasma formed from the etchant gas chemistry to etch through the BARC organic planarization layer so as to define trenches in the BARC organic planarization layer to form a mask from the BARC organic planarization layer for etching a low-k dielectric material thereunder.

18. The method of claim 17, wherein etching the organic planarization layer comprises etching trenches of disparate cross-sectional areas with a substantially same etch rate.

19. The method of claim 17, wherein introducing comprises introducing the etchant gas chemistry of N2:H2:O2 with a flow ratio of less than about 10:10:2, respectively, and wherein etching comprises etching with a bias power frequency of about 13.56 MHz, a bias power of about 800 Watts, and a plasma source power of about 1200 Watts.

20. An organic BARC etch method to form low k damascene integrated circuit device using a plasma reactor, the method comprising:
   providing a semiconductor substrate having an etch stop layer formed over a trench metal layer on the substrate;
   forming a low k dielectric layer over the etch stop layer;
   depositing a via patterned photoresist layer over the low k dielectric layer;
   removing of the photoresist layer and thereafter etching through the low k dielectric layer to the etch stop layer, to form a via opening;
   forming an organic planarization layer over the via;
   forming of a trench mask from a photoresist layer and a hardmask layer over the BARC organic planarization layer;
   introducing an etchant gas mixture comprising: N2; H2; and O2 into the plasma reactor; and
   etching the BARC organic planarization layer using the trench mask to form a trench opening in the BARC organic planarization layer to the via using the etchant gas mixture to form a mask from the BARC organic planarization layer for etching the low-k dielectric material thereunder.

21. The method of claim 20, wherein the etchant gas mixture flow ratio of N2:H2:O2 is about 10:10:x, respectively, where x is in a range from about 1 to about 3.

22. The method of claim 21, wherein the etchant gas mixture flow ratio of N2:H2:O2 is about 10:10:2, respectively.

23. The method of claim 20, wherein the BARC organic planarization layer comprises organic compounds similar in chemical structure to the photoresist layer.

24. The method of claim 20 further comprising:
   forming a trench pattern in the low k dielectric layer using the etched BARC organic planarization layer as an etch mask;
   stripping the BARC organic planarization; and opening the etch stop layer to expose the trench metal layer.

* * * * *